United States Patent [19]
Lee et al.

[11] Patent Number: 5,858,826
[45] Date of Patent: Jan. 12, 1999

[54] METHOD OF MAKING A BLANKET N-WELL STRUCTURE FOR SRAM DATA STABILITY IN P-TYPE SUBSTRATES

[75] Inventors: Chung-Yuan Lee; Chun-Yen Chang; Sun-Chieh Chien; Chen-Chiu Hsue, all of Hsin-Chu, Taiwan

[73] Assignee: United Microelectronics Corporation, Taiwan

[21] Appl. No.: 786,052

[22] Filed: Jan. 10, 1997

Related U.S. Application Data

[60] Provisional application No. 60/010,053 Jan. 16, 1996.
[51] Int. Cl.$^6$ ............................................. H01L 21/8238
[52] U.S. Cl. ......................... 438/228; 438/227; 438/228; 438/238; 438/527
[58] Field of Search ................................... 438/199, 218, 438/225, 227, 228, 527, 526, 238

[56] References Cited

U.S. PATENT DOCUMENTS

| | | | |
|---|---|---|---|
| 5,393,677 | 2/1995 | Lien et al. ............................... | 438/450 |
| 5,494,843 | 2/1996 | Huang ...................................... | 438/210 |
| 5,501,993 | 3/1996 | Borland ................................... | 438/526 |
| 5,573,963 | 11/1996 | Sung ........................................ | 438/228 |
| 5,698,458 | 12/1997 | Hsue et al. .............................. | 438/228 |

*Primary Examiner*—Trung Dang
*Attorney, Agent, or Firm*—Rabin & Champagne, P.C.

[57] ABSTRACT

SRAMs conventionally formed on N-type substrates are instead formed on P-type substrates which have had the surface layer of the substrate converted to a blanket N-type well region. Preferably, the blanket N-type well region is formed by ion implantation of phosphorus ions to a dosage of between $5 \times 10^{12}$ to $2 \times 10^{13}/cm^2$ at an energy of 200–1000 KeV. Use of a P-type substrate having a blanket N-well region formed by ion implantation are less expensive than the N-type substrates conventionally used, and make the SRAM processing techniques compatible with the P-type substrates conventionally used in microprocessors and other logic devices.

11 Claims, 6 Drawing Sheets

METHOD OF MAKING A BLANKET N-WELL STRUCTURE FOR SRAM DATA STABILITY IN P-TYPE SUBSTRATES

This application claims priority from provisional application Ser. No. 60/010,053, filed Jan. 16, 1996.

BACKGROUND OF THE INVENTION

1. Field of the Invention

The present invention relates to the preparation of semiconductor substrates and to semiconductor circuits incorporating MOS devices, such as static random access memories (SRAMs).

2. Description of the Related Art

A variety of semiconductor circuits incorporate MOS devices formed within isolation wells. Of particular note are the semiconductor circuits which include NMOS devices, such as SRAMs of the type which incorporate NMOS and PMOS field effect transistors within memory and input/output (I/O) circuits. Conventionally, the NMOS devices of such an SRAM are formed within P-type isolation wells to improve the performance of the NMOS devices, regardless of whether the NMOS devices are part of the SRAM memory cells or whether the NMOS devices are within the I/O circuitry of the SRAM. Typically, P-type isolation wells are formed within N-type regions. For example, SRAMs may be formed in N-type silicon substrates so that a p/n junction is formed at the boundary between the N-type substrate and the P-type wells in which the NMOS devices of the SRAM are formed. The p/n junction formed between the P-type well and N-type substrate limits the loss of data from memory cells caused by either I/O bounce or alpha-particle decay by isolating the active regions of the memory cell devices from the substrate in which noise carriers are generated. I/O bounce can inject free charge carriers into the substrate of a semiconductor device in response to the presence of noise signals on the input or output terminals of the device. Alpha-particle decay within the substrate also generates free carriers in the substrate. If the NMOS devices of a semiconductor circuit were not formed within isolation wells, then carriers injected into the substrate or generated within the substrate could reach the active region of the NMOS device, resulting in the loss of data. When NMOS devices are formed within P-type isolation wells having a p/n junction separating the isolation well from the N-type substrate, carriers injected into the substrate or generated within the substrate generally do not reach the active region of the NMOS device because of the potential barrier associated with the p/n junction between the P-type well and the N-type substrate.

While N-type silicon substrates provide desirable performance advantages for NMOS devices which incorporate P-type isolation wells, the use of N-type substrates has two significant disadvantages when compared to the use of P-type silicon substrates. First, N-type silicon substrates are more expensive than P-type silicon substrates. It would be desirable to use P-type silicon substrates to reduce the cost of producing semiconductor circuits which include NMOS devices formed within P-wells. Second, microprocessors and other types of logic circuits are typically formed on P-type substrates. It would be desirable to develop a process whereby MOS devices which utilize P-type isolation wells could be formed on the same substrate with microprocessors or logic circuits, providing better system integration and allowing the formation of more complex semiconductor circuit.

SUMMARY OF THE PREFERRED EMBODIMENTS

In accordance with one preferred embodiment of the present invention, an NMOS device is formed by providing a P-type substrate having a surface and forming a blanket N-well region on at least a portion of the surface of the P-type substrate. The process continues by forming a P-well isolation region within the blanket N-well region, forming N-type source and drain regions within the P-well isolation region and forming a gate insulator and a gate corresponding to the N-type source and drain regions.

A different aspect of the present invention can be used to form an SRAM by providing a P-type substrate having a surface and ion implanting phosphorus ions through the surface of the P-type substrate and annealing the implantation to form a blanket N-well region. The processing includes forming a plurality of P-well regions and a plurality of second N-well regions within the blanket N-well region, forming N-type source and drain regions within a plurality of the P-well isolation regions, forming P-type source and drain regions within a plurality of the N-well isolation regions, forming a gate insulator and a gate corresponding to each of the N-type source and drain regions, and forming a gate insulator and a gate corresponding to each of the P-type source and drain regions.

DETAILED DESCRIPTION OF THE PREFERRED EMBODIMENTS

Figure 1:
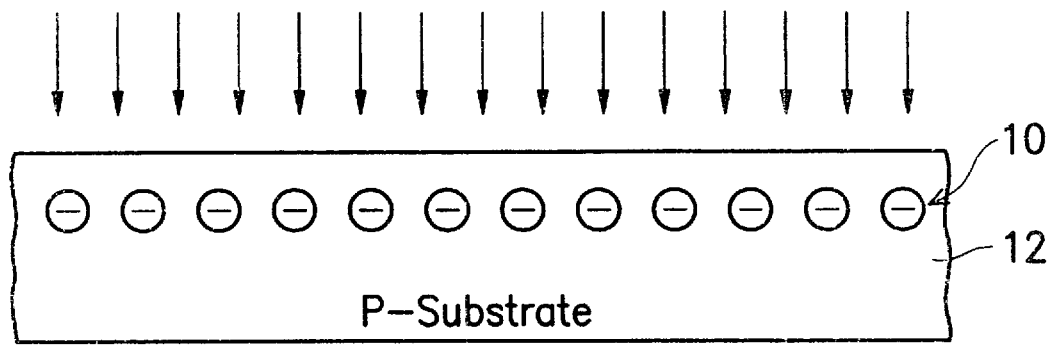
FIGS. 1–3 illustrate the formation of a substrate having a blanket N-well surface layer in accordance with the present invention.

Preferred embodiments of the present invention provide a P-type substrate having at least part of a surface layer converted into N-type material. Particularly preferred embodiments of the present invention convert the surface of a P-type substrate to N-type material by blanket ion implantation of N-type dopants and subsequent drive-in anneal to form a blanket N-well region having a depth of approximately four microns or less. Subsequent processing may include implantation or other doping steps to form P-type wells and, if desired, N-type wells. Further processing may include the formation of PMOS and NMOS FETs within their respective isolation wells, definition of memory cell devices, formation of buffers and other I/O circuitry, and the formation of the other circuitry which makes up an SRAM. Using ion implantation to convert at least the surface of a P-type substrate into an N-type blanket well region suitable for forming both P-wells and NMOS devices within the wells, provides a substrate suited to the formation of, for example, an SRAM that is cheaper than those conventionally formed on N-type substrates. This is due not only to the lower cost of P-type substrates as compared to N-type substrates, but also to the low cost of a blanket ion implantation procedure. By implementing a blanket N-well process for a portion of a P-type substrate, NMOS devices having appropriate substrate isolation structures can be formed economically within a microprocessor circuit or in a logic circuit formed in a P-type substrate.

A particularly preferred embodiment of the present invention is now described with reference to FIGS. 1–3. The substrate illustrated in these figures is a P-type substrate of the type that is readily available from a variety of commercial vendors and may have, for example, a conductivity of a few .cm. Phosphorus ions are implanted through the surface of the P-type substrate 12 to a dosage of about $5 \times 10^{12}$–$2 \times 10^{13}$ cm$^2$ or greater at an energy of about 200–1000 KeV or greater. For the doping step illustrated in FIG. 1, implantation is preferred over diffusion for obtaining the desired N-well blanket dopant distribution because it is easier to obtain a sufficiently deep dopant distribution when using implantation than it is with diffusion. Implantation is also preferred over growth of an epitaxial layer of N-type silicon on the P-type substrate, because such an epitaxial growth would be more expensive than ion implantation. While either of these less preferred doping methods might form an acceptable blanket N-well region, use of these methods would not achieve all of the advantages (i.e., low cost) presently associated with the use of ion implantation. Phosphorus implantation is particularly preferred for the formation of the blanket N-well region. Although an arsenic implantation will produce generally satisfactory results, phosphorus ions can be implanted deeper than arsenic ions for a given energy and phosphorus implantation damages the device substrate less than arsenic implantation. In addition, phosphorus implantation typically forms more gently graded junctions than does arsenic implantation, which is desirable in certain preferred embodiments of the present invention to prevent a sharp junction from undesirably affecting the active regions of devices formed on the blanket N-well surface region.

To avoid the expense of additional masking steps, it is preferable to make the FIG. 1 implantation as a blanket implantation over the entire substrate. Low cost will still generally be maintained if the FIG. 1 implantation is made through one or more layers deposited over the surface of the substrate 12. For example, a gate insulator may be formed on the surface of the substrate, and the implantation may be made through the gate insulator. Alternately, both a gate insulator and a layer of gate material such as polysilicon may be deposited on the surface of the substrate 12, and the implantation may be made through both the gate insulator and the layer of gate material.

Ion implantation over an entire substrate is used to form a blanket N-well region in particularly preferred embodiments of the invention, such as when the blanket N-well process is used for making a stand alone SRAM circuit. There may also be instances when a blanket implantation is made only over a desired portion of a circuit, such as when a cache SRAM section is formed within a microprocessor circuit. This is particularly desirable in microprocessor designs which provide a single, large, on-chip cache memory section which acts as short term storage for frequently accessed data. In such an application, the term blanket implantation refers to an implantation made over the desired portion of the substrate in which a plurality of NMOS devices are to be formed. Thus, a mask having a single opening over the cache memory section of the microprocessor is provided and the N-well is preferably formed by implantation at an early stage so that formation of the MOSFETs within the cache memory section can be performed as part of the process for manufacturing MOSFETs within the logic and I/O sections of the microprocessor. A similar strategy is preferably used in the formation of any large, contiguous array of NMOS memory transistors, whether in a memory chip or when the memory array is part of a logic circuit such as microprocessor or digital signal processor (DSP). The present blanket N-well process differs from a triple well process in which a distinct N-well region is formed around each individual P-well within a circuit both in the extent of the implantation and in the number of mask steps required. Such a triple well process requires the use of more masks than the preferred blanket N-well process, with the associated additional processing time, alignment difficulties and impact on device yield.

Figure 2:
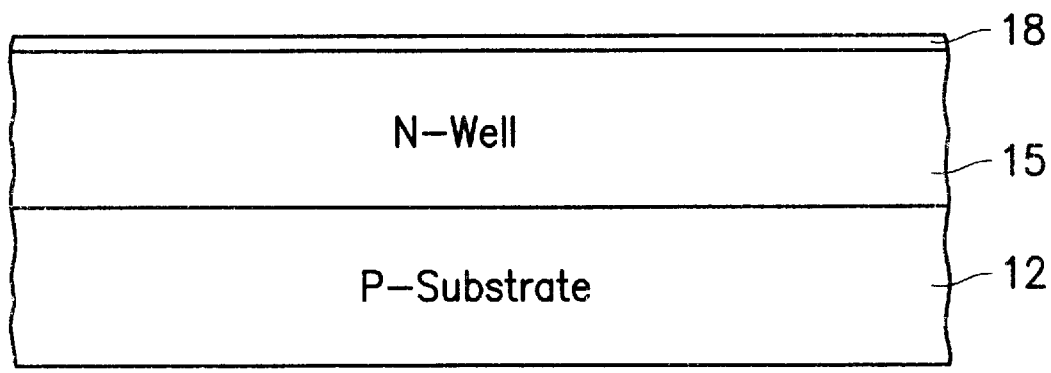
Figure 3:
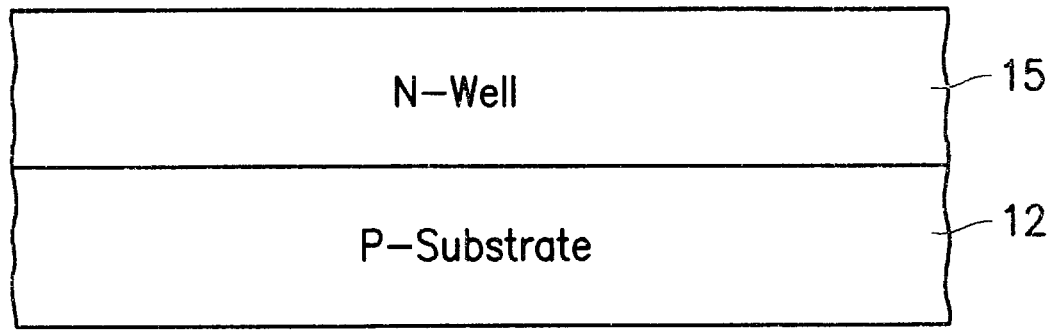

FIG. 2 illustrates a drive-in step that might be used to diffuse and activate the phosphorus implantation of FIG. 1. The anneal step is performed in the typical fashion, for example at a temperature of approximately 1000° C. While the anneal step is preferably made at the illustrated early stage in device processing, this anneal step might, in some instances, be performed at a subsequent step in device processing. For example, the illustrated anneal step might be made during a subsequent thermal processing step such as that used to activate the P-well and N-well implantations. The blanket N-well region 15 formed by the drive-in anneal is typically between less than two to four microns in depth in accordance with the present state of the SRAM art. Of course, should it be desirable to form a shallower blanket N-well region, than the blanket implantation conditions might be modified to implant more shallowly or a rapid thermal anneal process might be used to activate the implanted impurities while minimizing diffusion. The depth of the blanket N-well region is preferably sufficient to allow the formation of an acceptable P-type isolation well within the blanket N-well region 15 with a p/n junction formed between the P-well and the blanket N-well region 15 to provide isolation from carriers formed in the rest of the substrate 12.

Figure 4:
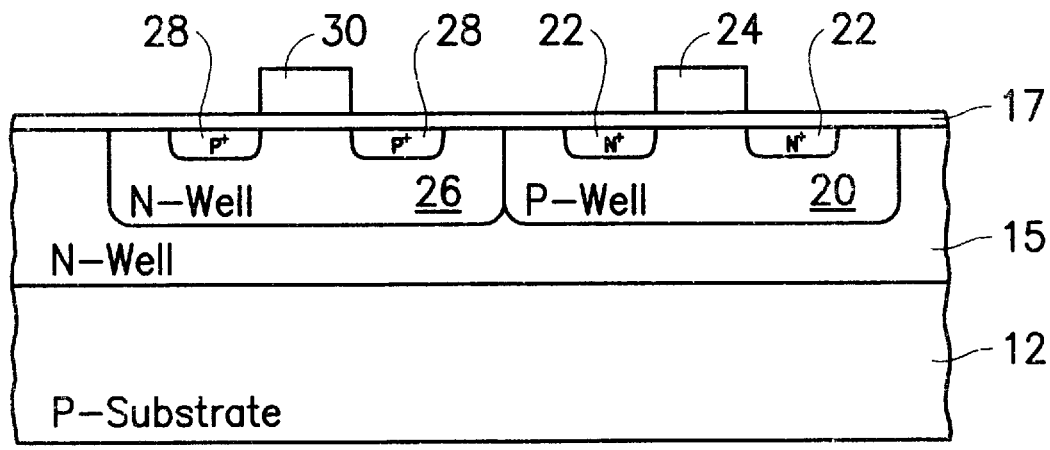
FIG. 4 illustrates a MOS device, of a kind often found in an SRAM memory cell, formed in the substrate of FIG. 3.

It is often desirable to form a thermal oxide layer 18 on the surface of the N-type surface layer 15, preferably during the phosphorus drive-in step. The thermal oxidation consumes a portion of the surface of the substrate, and subsequent removal of the thermal oxidation removes much of the damage caused by the implantation. The thermal oxidation layer is removed by, for example, plasma etching using CHF$_3$ to produce the substrate as illustrated in FIG. 3. Subsequent processing is performed to form a P-well 20, N-well 26, NMOS source and drain regions 22, PMOS source and drain regions 28, gate oxide 17, and NMOS and PMOS gates 24 and 30, thereby forming the MOS device illustrated in FIG. 4. As is well known in the art, SRAMs typically include many MOS devices like those illustrated in FIG. 4. The processing used to form the MOS device illustrated in FIG. 4 may be substantially the same as that conventionally used in forming SRAM NMOS and PMOS devices, with certain adjustments made in doping levels to compensate for the dopants used in forming the blanket N-well region 15. Conventionally, the P-wells of SRAM NMOS devices are formed by implanting boron to a dosage of about $1 \times 10^{13}$/cm$^2$ with an energy of about 200 KeV. The N-wells of SRAM PMOS devices formed on conventional N-type substrates are formed by implanting phosphorus to a dosage of about $2 \times 10^{13}$/cm$^2$ with an energy of about 400 KeV. The particular doping levels chosen for these regions depend on the precise characteristics to be obtained for the SRAM device. When the SRAM MOS device of FIG. 4 is formed, it is preferred that the P-well and N-well regions be formed so as to have a majority carrier concentration of the desired level which requires that the conventional doping level be adjusted. Accordingly, if a phosphorus implantation of $5 \times 10^{12}/cm^2$ was made to form the blanket N-well region, then the P-well 20 implant would preferably consist of a boron implantation to a dosage of about $1.3 \times 10^{13} – 1.5 \times 10^{13}/cm^2$ at an energy of about 200 KeV. The phosphorus implant preferred to achieve a total dosage of $2 \times 10^{13}/cm^2$ for the N-well region 26 consists of a dosage of about $1.5 \times 10^{13}/cm^2$ at an energy of about 400 KeV. As with the conventional SRAM process, the particular final doping levels are preferably selected in accordance with the desired device performance, in the manner well known in the art.

Figure 5:
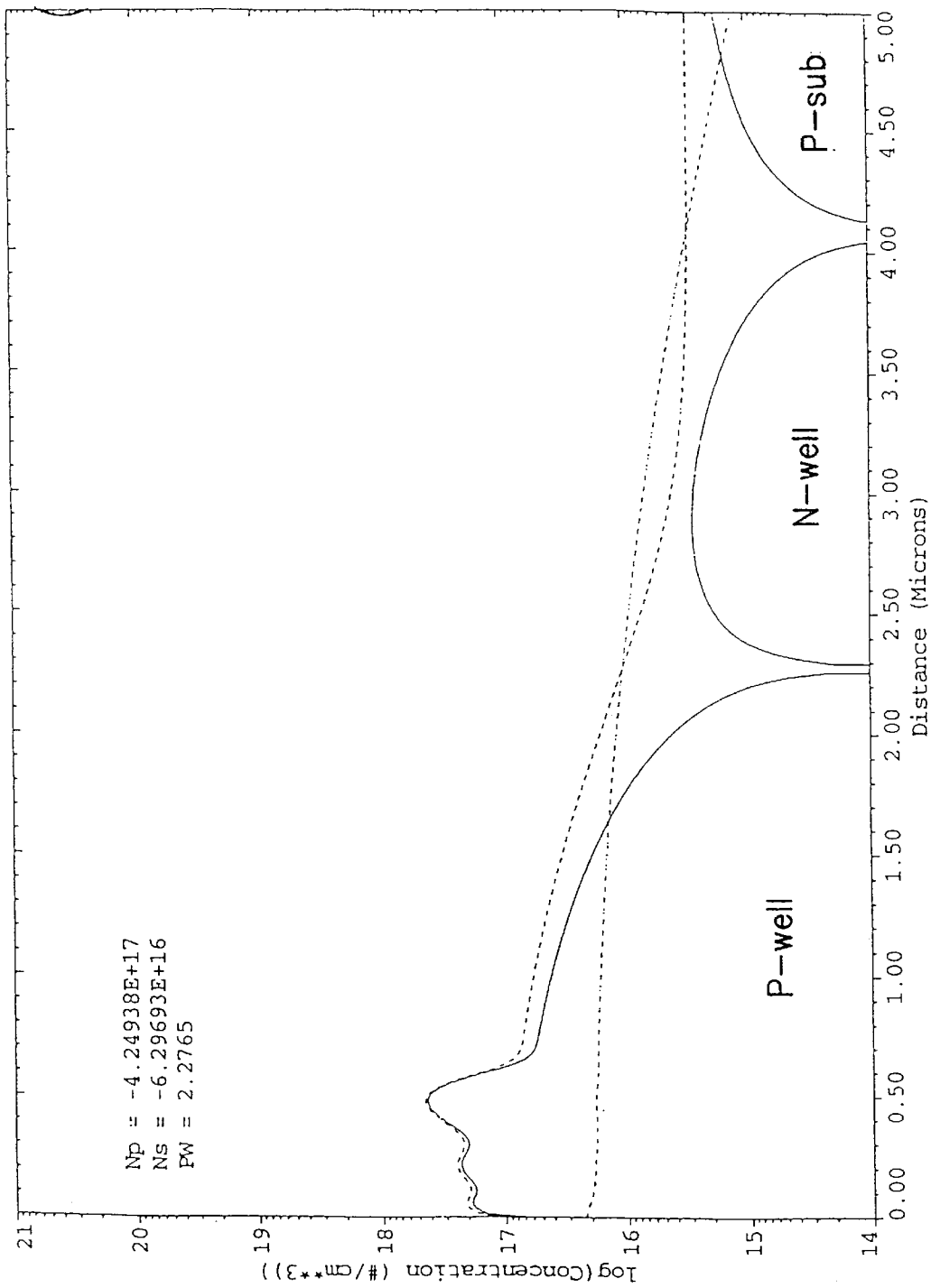
FIG. 5 shows the P-well channel profile for the blanket N-well process.
Figure 6:
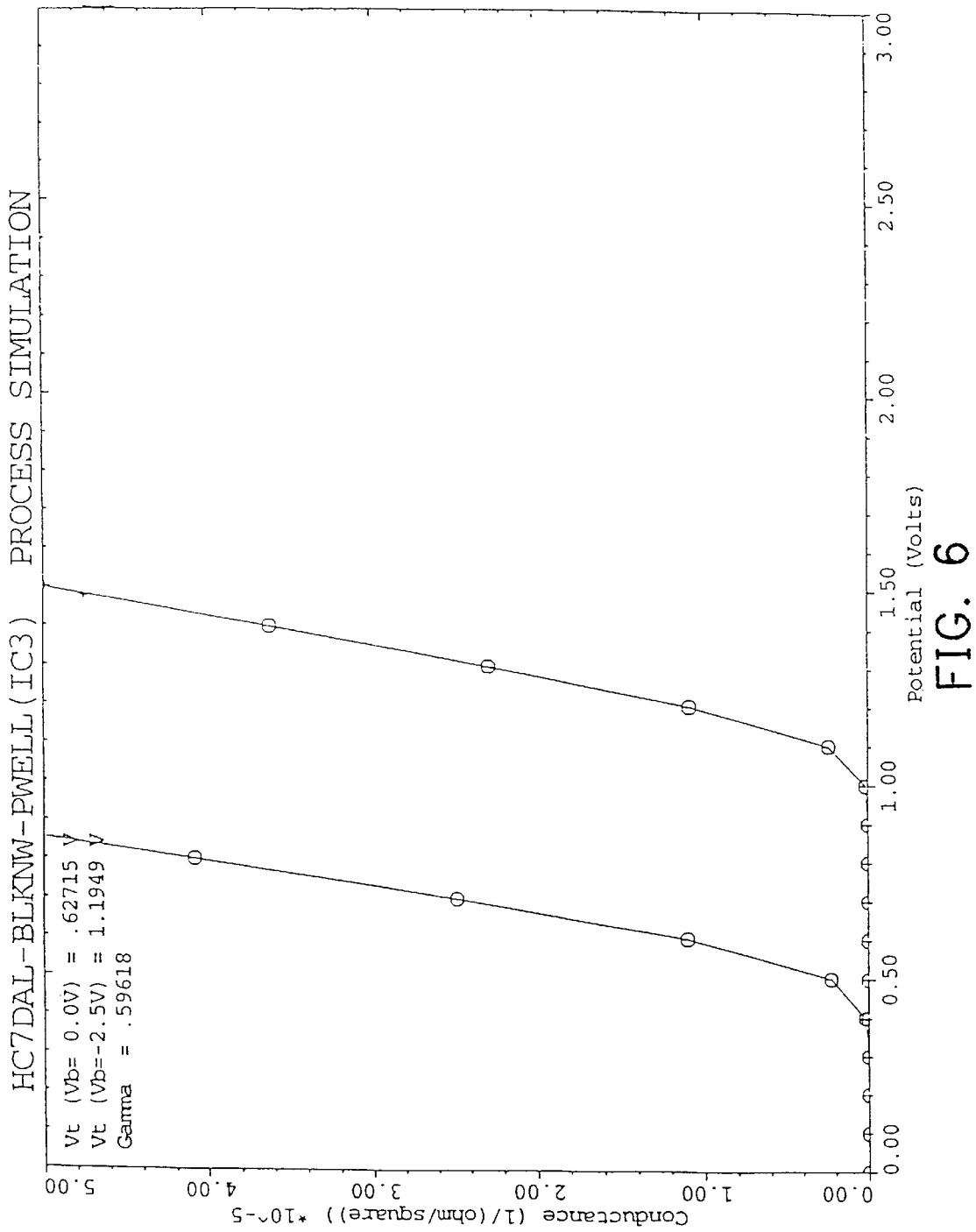
FIG. 6 illustrates the threshold voltage characteristics and body factor gamma for the blanket N-well process.

FIG. 5 shows the calculated doping profile as a function of channel depth for a P-well made in accordance with the present invention. The blanket N-well region has a depth of about 4.1 microns and the P-well region has a depth of about 2.27 microns within the blanket N-well region. FIG. 6 illustrates the calculated threshold voltage characteristics (conductance versus gate voltage) for the FIG. 5 doping profile. For no applied substrate bias, the threshold voltage is calculated to be about 0.63 V and, for a substrate bias of –2.5 V, the threshold voltage is 1.20 V. The body effect factor gamma is calculated as 0.60. Each of these parameters is comparable to those obtained for NMOS devices formed in the conventional (N-type substrate) fashion generally used for SRAM devices, and thus the expected device performance for an NMOS device made in accordance with the present invention is expected to be comparable to the performance of devices formed on conventional substrates.

Figure 7:
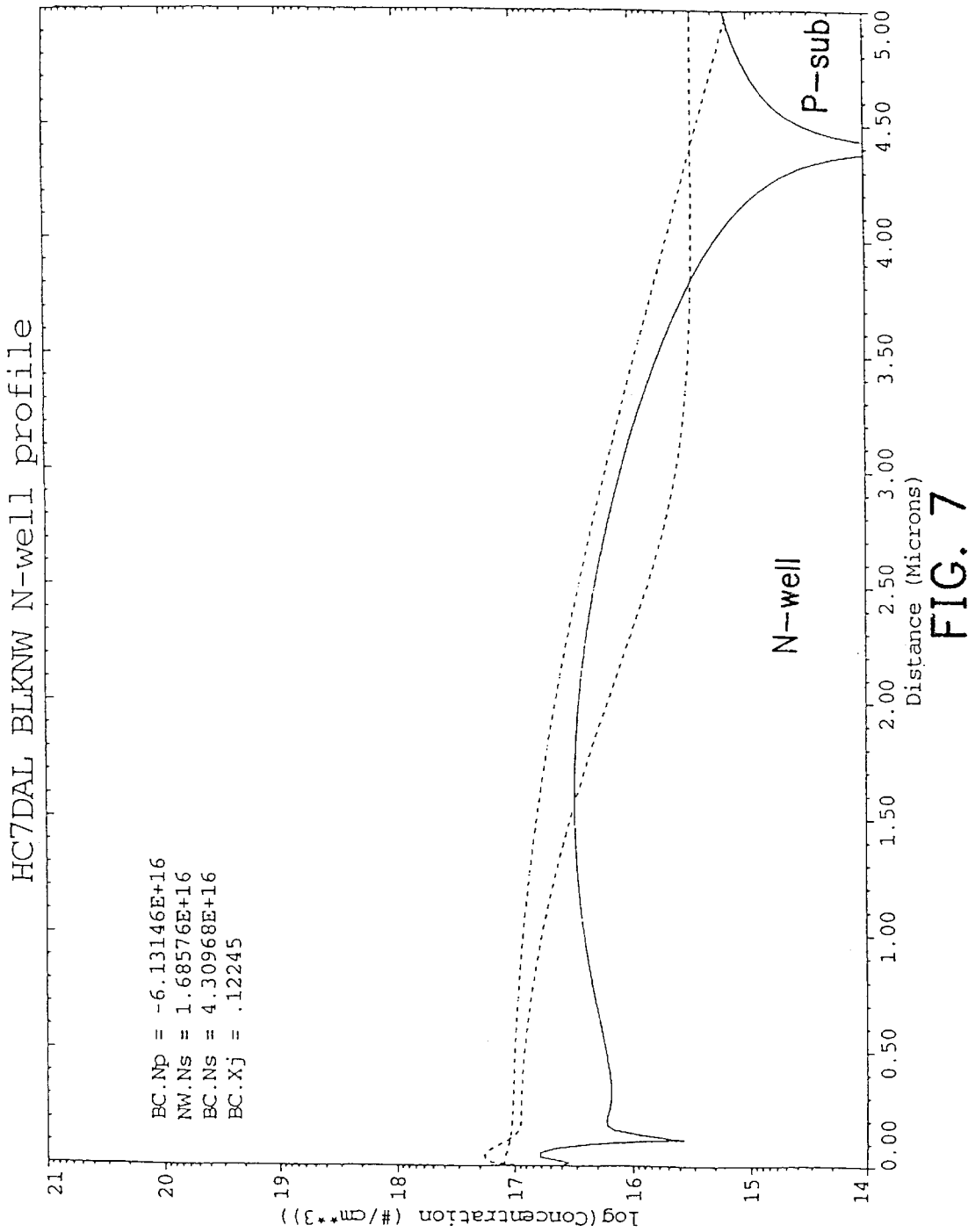
FIG. 7 shows the N-well channel profile for the blanket N-well process.
Figure 8:
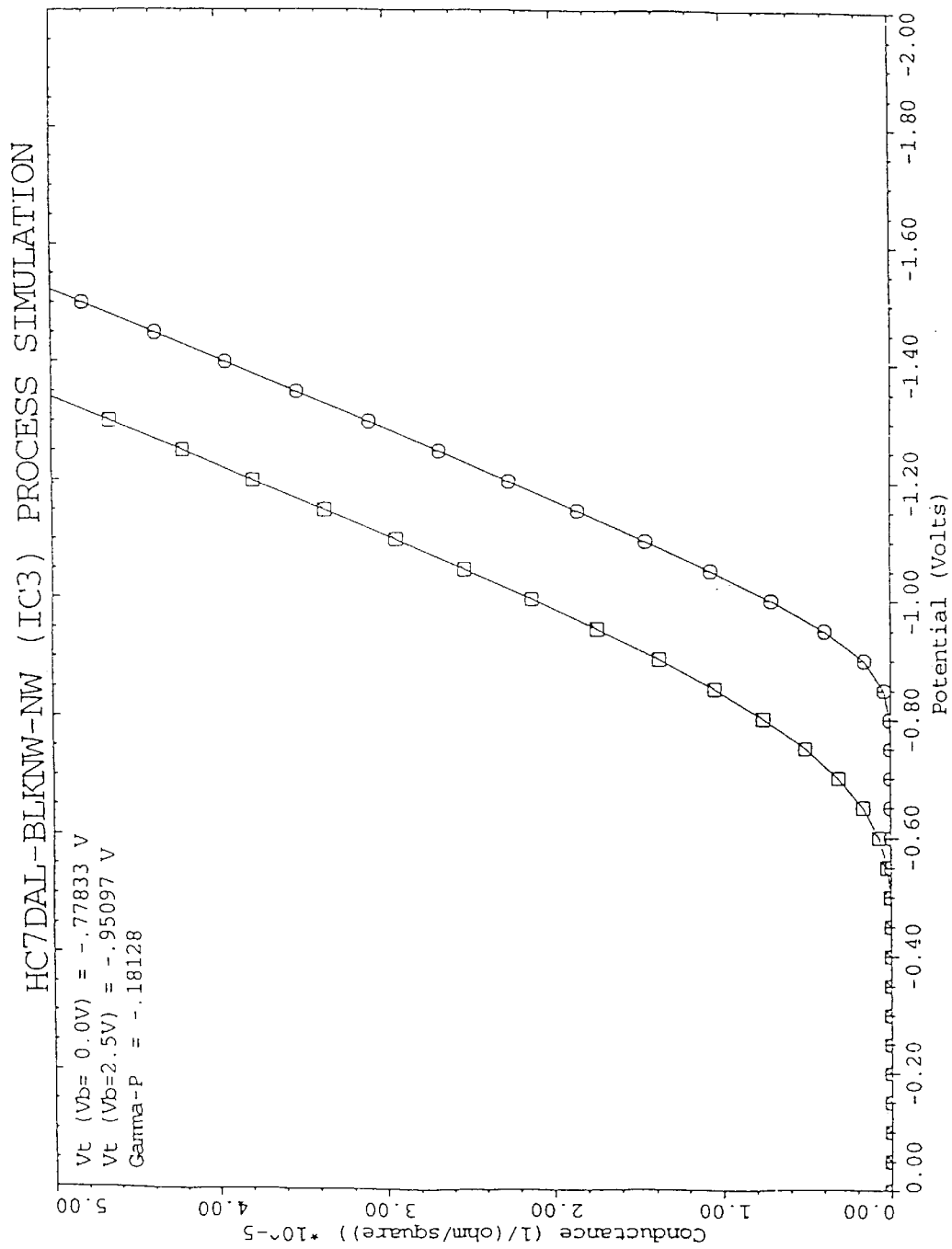
FIG. 8 illustrates the PMOS device threshold voltage and body factor gamma for the blanket N-well process.

Similarly, FIG. 7 shows the calculated doping profile as a function of channel depth for a N-well made in accordance with the present invention. For this portion of the device, the blanket N-well region extends to a depth of about 4.4 microns. The threshold voltage is calculated to be about –0.78 V for no applied substrate bias and the threshold voltage is –0.95 V for a substrate bias of 2.5 V. The body effect factor gamma is calculated as 0.18. Each of these parameters is comparable to those obtained for PMOS devices formed in the conventional (N-type substrate) fashion generally used for SRAM devices, and thus the expected device performance for a PMOS device made in accordance with the present invention is expected to be comparable to the performance of devices formed on conventional substrates.

While the present invention has been described with reference to certain preferred embodiments of the present invention, the scope of the present invention is not limited to the particular embodiments described herein. Rather, the scope of the present invention is to be determined from the following claims.

What is claimed:

1. A method of making an NMOS device comprising:
   providing a P-type substrate having a surface;
   forming a blanket N-well region on at least a portion of the surface of the P-type substrate by implanting phosphorous ions to a dosage of between $5 \times 10^{12}$ to $2 \times 10^{13}/cm^2$;
   forming a P-well isolation region within the blanket N-well region;
   forming N-type source and drain regions within the P-well isolation region;
   forming a gate insulator and a gate corresponding to the N-type source and drain regions;
   forming a second N-well region;
   forming P-type source and drain regions within the second N-well region; and
   forming a gate insulator and a gate corresponding to the P-type source and drain regions.

2. The method of claim 1, wherein said forming a blanket N-well region is characterized by implanting impurity ions substantially over the entire surface of the P-type substrate.

3. The method of claim 2, wherein the impurity ions are implanted into the surface of the P-type substrate with no surface layer covering the surface of the P-type substrate.

4. The method of claim 1, wherein the P-well region dopant is formed with a concentration of dopants in excess of a concentration of dopants used to form the second N-well region.

5. A method of making an SRAM comprising:
   providing a P-type substrate having a surface;
   ion implanting phosphorus ions through the surface of the P-type substrate and annealing the implantation to form a blanket N-well region;
   forming a plurality of P-well regions and a plurality of second N-well regions within the blanket N-well region;
   forming N-type source and drain regions within a plurality of the P-well isolation regions;
   forming P-type source and drain regions within a plurality of the N-well isolation regions;
   forming a gate insulator and a gate corresponding to each of the N-type source and drain regions; and
   forming a gate insulator and a gate corresponding to each of the P-type source and drain regions.

6. The method of claim 5, wherein said ion implanting phosphorus ions is performed before said forming the gate insulator.

7. The method of claim 5, wherein said forming a plurality of P-well regions and a plurality of second N-well regions within the blanket N-well region are performed by ion implantation.

8. The method of claim 7, wherein a dopant dosage implanted to form the P-well regions is greater than a dopant dosage implanted to form the second N-well regions.

9. The method of claim 8, wherein said ion implanting phosphorus ions is characterized by implanting phosphorus ions to a dosage of between $5 \times 10^{12}$ to $2 \times 10^{13}/cm^2$.

10. The method of claim 5, wherein said ion implanting phosphorus ions is characterized by implanting phosphorus ions to a dosage of between $5 \times 10^{12}$ to $2 \times 10^{13}/cm^2$.

11. The method of claim 5, wherein said ion implanting phosphorus ions is characterized by implanting phosphorus ions at an energy of 200–1000 KeV.

* * * * *